United States Patent [19]

Vasudev

[11] Patent Number: 4,659,392
[45] Date of Patent: Apr. 21, 1987

[54] SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS

[75] Inventor: Prahalad K. Vasudev, Santa Monica, Calif.

[73] Assignee: Hughes Aircraft Company, Los Angeles, Calif.

[21] Appl. No.: 890,449

[22] Filed: Jul. 30, 1986

Related U.S. Application Data

[62] Division of Ser. No. 714,287, Mar. 21, 1985.

[51] Int. Cl.⁴ .................. H01L 21/263; H01L 21/225
[52] U.S. Cl. ........................... 148/1.5; 29/571;
29/576 B; 148/175; 148/187; 148/DIG. 77;
357/91
[58] Field of Search ............ 148/1.5, 175, 187;
29/576 B, 571; 357/91

[56] References Cited

U.S. PATENT DOCUMENTS

| | | | |
|---|---|---|---|
| 4,385,937 | 5/1983 | Ohmura | 29/576 B |
| 4,498,224 | 2/1985 | Maeguchi | 29/571 |
| 4,509,990 | 4/1985 | Vasudev | 148/1.5 |
| 4,523,963 | 6/1985 | Ohta et al. | 29/571 |
| 4,584,026 | 4/1986 | Wu et al. | 148/1.5 |
| 4,588,447 | 5/1986 | Golecki | 148/1.5 |
| 4,617,066 | 10/1986 | Vasudev | 148/1.5 |

OTHER PUBLICATIONS

Reedy et al, Jour. Crystal Growth, 58 (1982) 53.
Yoshii et al, Jap. Jour. Appl. Phys. 21 (1982) Supplement 21-1, p. 175.
Yamamoto et al, Appl. Phys. Letts. 34(6), Mar. 1979, p. 403.
Lau et al, Appl. Phys. Letts. 34 (1979) 76.

Primary Examiner—Upendra Roy
Attorney, Agent, or Firm—Terje Gudmestad; Paul M. Coble; Anthony W. Karambelas

[57] ABSTRACT

A process is disclosed for preparing selectively doped and recrystallized silicon-on-insulator semiconductor wafers, and wafers prepared thereby, wherein successive amorphizing and annealing sequences are utilized to optimize the defect structure and doping of multiple regions or islands of the silicon on an insulator substrate. Prior to fabrication of the active devices, the various silicon islands are given customized ion implantation treatments to amorphize a silicon near-interface layer under differing sets of implantation conditions. The entire wafer is then annealed to achieve downward epitaxial recrystallization of the amorphized near-interface layers in all of the amorphized islands, growing on the near-surface crystalline layer of the silicon remote from the interface. The near-surface layers of the islands are then amorphized and annealed to achieve upward epitaxial recrystallization of the layers on the underlying silicon layer. By this approach, the crystalline defect structure and the dopant distributions of the islands are individually optimized for specific applications.

11 Claims, 6 Drawing Figures

SELECTIVE AREA DOUBLE EPITAXIAL PROCESS FOR FABRICATING SILICON-ON-INSULATOR STRUCTURES FOR USE WITH MOS DEVICES AND INTEGRATED CIRCUITS

This is a division of application Ser. No. 714,287, filed Mar. 21, 1985.

BACKGROUND OF THE INVENTION

This invention relates to the fabrication of semiconductor devices, and, more particularly, to a selective area process utilizing multiple steps of ion implantation and annealing to optimize the defect structure and dopant distribution in semiconductor wafers.

The advantage of utilizing a composite substrate having a single crystal semiconductor layer, such as silicon, epitaxially deposited on a supporting insulator substrate, are well-recognized in the field of semiconductor devices and integrated circuits. These advantages include the substantial reduction of parasitic capacitances between charged active regions and the substrate, and the effective elimination of leakage currents flowing between adjacent active devices. These advantages are accomplished by employing as the substrate an insulator material with a high dielectric constant, and providing that the conduction path of any interdevice leakage current must pass through the substrate. Examples of such materials include silicon on calcium fluoride, silicon on silica, silicon on spinel, silicon on sapphire, and silicon on zirconia.

Because of the very small dimensions involved in such devices, which may be on the order of tenths of micrometers, the concentrations and gradients of defects and dopant species in the silicon are critical to the operation of the active devices fabricated thereupon. For many active devices, it would be desirable that the silicon layer be completely single crystal and substantially defect free in the necessary thickness. The interface between the silicon layer and the supporting insulator substrate should have a minimum of crystal lattice discontinuities. On the other hand, it is desirable in many instances, for certain applications and types of active devices fabricated on the silicon, that the defect and dopant structures be individually tailored and optimized.

Attempts to achieve optimized defect and dopant structures face significant obstacles due to the need to anneal the wafers at high temperatures to reduce the defect concentration, and the dissolution of dopant species from the insulator substrate into the silicon at such high temperatures. That is, the necessary high-temperature annealing treatment to minimize the silicon defect concentration also may result in a high concentration of the insulator species, such as aluminum ions, in the silicon. While the introduction of aluminum dopant into the silicon may be desirable in some instances, it is sufficient to render other active devices inoperable.

By way of a response to this problem, a number of implantation and specialized annealing processes have been developed. In particular, techniques have been developed to reduce the defect concentration in the silicon layer without resorting to high temperature annealing. One such process, known as solid phase epitaxy, or SPE, provides a low temperature subprocess for improving the crystallinity of the silicon epitaxial layer without heating the wafer to temperatures greater than about 600° C. The SPE process involves the high energy implantation of an ion species such as silicon into the silicon epitaxial layer at a dose sufficient to create a substantially amorphous silicon layer lying adjacent the silicon-insulator interface, while leaving a substantially crystalline layer at the surface of the original epitaxial silicon layer. The ion species is implanted below the top layer of the epitaxial silicon layer so that the maximum disruption of the silicon crystal lattice is in a buried layer near the silicon-sapphire interface to ensure that the amorphous region is adjacent the sapphire substrate. The wafer is then given a low temperature annealing treatment to achieve an epitaxial recrystallization of the buried amorphized silicon layer. With this process, the silicon surface layer remains partly disrupted due to the ion implantation, and the buried near-interface silicon layer is recrystallized into a structure having a lower density of crystalline defects.

While the solid phase epitaxy process does significantly improve the crystallinity of the silicon epitaxial layer, it also facilitates the incursion of insulator-originated contaminants into the silicon epitaxial layer. For example, if the substrate is sapphire, aluminum species can migrate into the silicon layer, thereby contaminating the layer and effectively precluding the practical use of integrated circuits fabricated on contaminated substrates so processed.

Therefore, there exists a continuing need for a process for controlling and optimizing the defect and dopant concentrations in silicon-on-insulator wafers to be used in fabricating active semiconductor devices thereupon. Such a process would ideally allow the preparation of a substantially defect-free silicon single crystal on the insulating substrate, while at the same time either utilizing or compensating for the effect of the incursion of substrate-originated contaminants that diffuse into the silicon layer. The process also should be fully compatible and integratable with existing conventional semiconductor device and integrated circuit fabrication technology. The present invention fulfills this need, and further provides related advantages.

SUMMARY OF THE INVENTION

The present invention provides a process for fabricating silicon-on-insulator wafers with device areas having low crystal defect densities in the silicon layer, and further providing for the optimization of the dopant species within the silicon layer, and articles made by this process. In the case of a sapphire substrate, the incursion of aluminum ions into intended N− regions (used for PMOS transistors) can be compensated by ion implantation of neutralizing species into a selectively defined island. On the other hand, the process promotes the beneficial diffusional incursion of aluminum ions into intended P− regions (used for NMOS transistors). The process is accomplished by ion implantation and annealing treatments utilizing conventional equipment, and is therefore fully compatible with conventional integrated circuit fabrication technology. In some instances, the process can result in considerable fabrication time and cost savings, due to the reduction in numbers of processing steps, and the temperatures and times of annealing operations.

In accordance with the invention, a process for preparing a semiconductor wafer on a silicon-on-insulator wafer base comprises the steps of furnishing a silicon-on-insulator wafer base having an interface defined between the silicon and the insulator; amorphizing a silicon near-interface layer of a first region of the wafer base by ion implantation under a first set of implantation conditions, wherein a surface layer of the silicon is not amorphized and the insulator is not amorphized; amorphizing a silicon near-interface layer of a second region of the wafer base by ion implantation under a second set of implantation conditions, wherein the surface layer of the silicon is not amorphized and the insulator is not amorphized; and annealing the wafer base to achieve downward epitaxial recrystallization of the amorphized near-interface layers of the first and second regions on the crystalline surface layer of the silicon.

More specifically, a process for preparing a semiconductor wafer comprises the steps of furnishing a silicon-on-insulator wafer base having islands therein and having an interface between the silicon and the insulator; amorphizing a silicon near-interface layer of a first island by ion implantation under a first set of implantation conditions; amorphizing a silicon near-interface layer of a second island by ion implantation under a second set of implantation conditions; annealing the wafer base to achieve downward epitiaxial recrystallization of the amorphized near-interface layers of the first and second islands on the crystalline layer of the silicon remote from the interface; surface amorphizing the silicon top surface layer of the wafer base, leaving an underlying silicon crystalline layer; and annealing the wafer base to achieve upward epitaxial recrystallization of the amorphized surface layer of the silicon on the underlying silicon crystalline layer. Optionally, after the first island is amorphized but before the second island is amorphized, the wafer base may be annealed to achieve downward epitaxial recrystallization of the amorphized layer of the first island on the crystalline silicon layer more remote from the interface.

In a particularly preferred embodiment, a process for preparing the silicon wafer comprises the steps of furnishing a silicon-on-insulator wafer base with the insulator being selected from the group consisting of sapphire and spinel; defining at least two islands in the silicon of the wafer base; implanting oxygen ions into a first island under implantation conditions sufficient to amorphize a silicon near-interface layer and so that the insulator is not amorphized; implanting silicon ions into a second island under implantation conditions sufficient to amorphize a silicon near-interface layer; annealing the wafer base to achieve downward epitaxial recrystallization of the amorphized near-interface layers of the first and second islands on the crystalline layer of the silicon remote from the interface; implanting silicon ions into the wafer base under implantation conditions sufficient to amorphize the silicon top surface layer, leaving an underlying silicon crystalline layer; and annealing the wafer base to achieve upward epitaxial recrystallization of the amorphized surface layer of the silicon on the underlying silicon crystalline layer.

In this preferred approach, implantation and annealing of the oxygen ions provides N− type doping to compensate for the aluminum incursion into the silicon layer resulting from possible sapphire damage during ion implantation and subsequent diffusion during annealing and renders the aluminum electrically inactive by forming aluminum-oxygen complexes. Electrical compensation of the P− aluminum doped near-interface layer of the silicon is achieved simultaneously with improvement of the crystalline quality. After this step, the islands can also receive the normal N− type phosphorus implantation for the required channel doping.

Care is taken during oxygen implantation to prevent heating of the insulating substrate, either by minimizing the dose current or conducting the implantation at a very low temperature, such as liquid nitrogen temperature. On the other hand, implantation of silicon ions into the second island is accomplished at a relatively high energy and dose level to intentionally induce the required amount of sapphire damage, thereby creating P− doping of the near-interface region of the silicon by aluminum to electrically compensate for the positive charge at the sapphire interface. Again, the simultaneous downward recrystallization significantly improves the crystal quality, giving high mobility in the silicon. Thus, by the selective amorphizing and doping procedure, both the N− and P− islands are separately and individually optimized for high crystal quality, optimum doping, and minimal silicon defect structure, as well as proper electrical compensation adjacent the sapphire interface, The wafers treated by any of the described processes can then be further processed by conventional techniques to fabricate semiconductor devices and integrated circuits. Such fabricated devices obtain improved performance as a result of the described prior selective treatment of the wafer. The improved performance is particularly striking when such devices are used in harsh environments, including those with high radiation exposure levels.

As will now be appreciated, the present invention provides an important and significant advance in the field of the fabrication of optimized semiconductor integrated circuitry using silicon-on-insulator structures. By combining carefully controlled ion implantation and recrystallization procedures with conventional device fabrication steps such as island etching, optimized structures for subsequent device fabrication can be achieved. Other features and advantages of the present invention will become apparent from the following more detailed description, taken in conjunction with the drawings, which illustrate, by way of example, the principles of the invention.

DETAILED DESCRIPTION OF THE PREFERRED EMBODIMENT

The process of the present invention is utilized to optimize various layers and regions of a semiconductor wafer base 10, having a silicon layer 12 epitaxially deposited upon an insulator substrate 14, which is preferably sapphire or spinel. In the preferred embodiment, the insulator substrate 14 is a sapphire single crystal having a surface orientation of (1102) (hexagonal Miller indices notation), and the silicon layer 12 is a single crystal having a surface crystallographic orientation (100) (cubic Miller indices notation). The sapphire substrate 14 is preferably from about 0.25 to about 0.40 millimeters thick, and the silicon layer 12 is preferably from about 0.4 to about 0.6 micrometers thick. The silicon layer 12 of this preferred wafer base 10 is conveniently fabricated on sapphire or spinel by chemical vapor deposition of silicon from silane ($SiH_4$) at a growth rate of about 2.4 micrometers per minute, a growth rate chosen to minimize the defect structure adjacent an interface 16 between the silicon layer 12 and the insulator substrate 14, and also to minimize the concentration of crystal defects in the silicon layer 12. Such preferred wafer bases 10 may be purchased from the Crystal Products Division of Union Carbide Corporation, San Diego, California 92123.

Figures 2, 3:
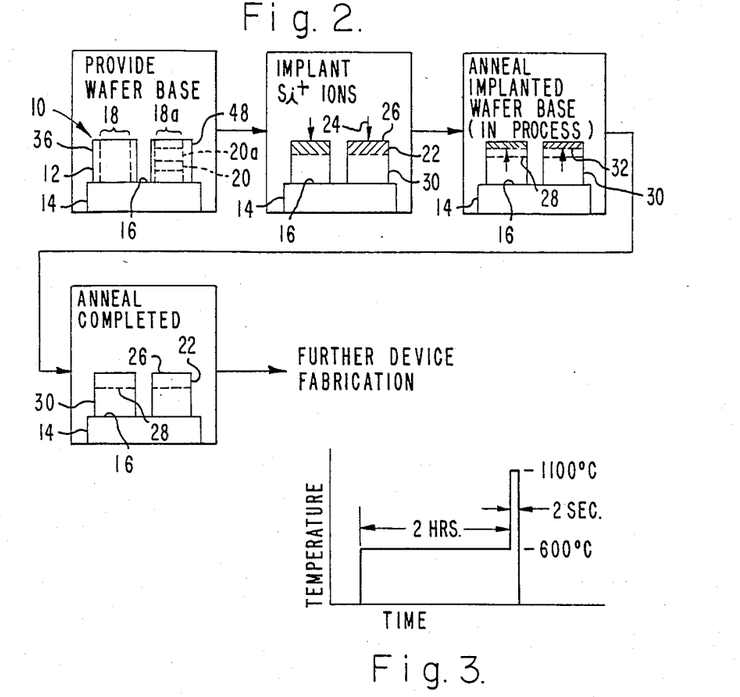
FIG. 2 is a schematic process flow diagram of a solid phase epitaxy and regrowth of a silicon surface layer of a silicon-on-insulator wafer base.
FIG. 3 is a graph of temperature plotted against time for a preferred annealing treatment in the process of FIG. 2.

The process of the present invention is utilized for selective optimization of different layers and regions of the wafer base 10. As used herein, a "region" 18 is a portion of a wafer base laterally separated from other regions, such as indicated by the numerals 18 and 18a in FIG. 2. That is, regions are related to each other in a side-by-side fashion. In contrast, "layers" such as at numerals 20 and 20a are vertically arranged portions of a wafer base 10, related to each other in a one-above-the-other or vertically stacked relation. Specific layers of interest are a portion of the silicon layer 12 adjacent the interface 16 between the layer 12 and the insulator substrate 14, termed the near-interface layer 40, and a portion of the silicon layer 12 remote from the interface 12 and adjacent the upper surface of the silicon layer 12, termed the near-surface layer 22. In FIG. 2, the regions 18 and 18a and the layers 20 and 20a, 22 and 40 are indicated by way of defining nomenclature, and are not intended to limit any aspect of the invention.

In a preferred embodiment of the invention, the silicon layer 12 is initially deposited to be of sufficient thickness for subsequent device fabrication, and typically may be on the order of from about 0.4 to about 0.6 micrometers. Optimization of the silicon layer 12 for the fabrication of specific active devices occurs in two separate processes, which may be applied serially or independently as part of the fabrication of the wafer base 10. In the first aspect, the near-interface layer 17 of the silicon layer 12 is regionally optimized by ion implantation in the near-interface layer 17 of the silicon layer 12 and subsequent downward epitaxial growth on the near-surface layer 22 of the silicon layer 12. In the second aspect, the near-surface layer of the silicon layer 12 is optimized by amorphization and upward epitaxial growth on the underlying crystalline silicon region. Various techniques may be utilized to define the regions to be optimized, and in one preferred embodiment, the regions are defined by first etching islands into the silicon layer 12. In another preferred embodiment, the regions are defined by masking the regions for optimization and converting unmasked portions to insulators. The regions could be defined by other techniques such as masking without etching islands, by lithographic techniques, or by selective programmed localized regional implantation of particular ions using a preselected pattern by focused ion beam technology.

In the portion of the process of the present invention to be next described, various regions are treated differently for selective optimization, and any technique which physically defines laterally displaced regions would be operable. In the preferred embodiment, the regions are defined by mesa etching of the silicon layer 12 into islands 34 with lateral geometries preselected to meet the requirements of particular device circuitry to lie on the wafer base 10. Mesa etching of the silicon film is accomplished by conventional etching procedures, preferably in a plasma etching reactor to provide vertical edges on the islands 34. (In FIG. 1 and FIG. 2, the islands 34 are illustrated as being relatively tall compared to their widths. This convention is adopted for the purpose of illustration within the constraint of space available for illustrations. In fact, in most instances the islands will be much wider than they are tall). The islands 34 are thus regions defined by the removal of portions of the silicon layer 12 between the islands 34. The etching of islands 34 is a routine step in the fabrication of integrated circuits, but other techniques for defining regions are equally acceptable.

Figure 5:
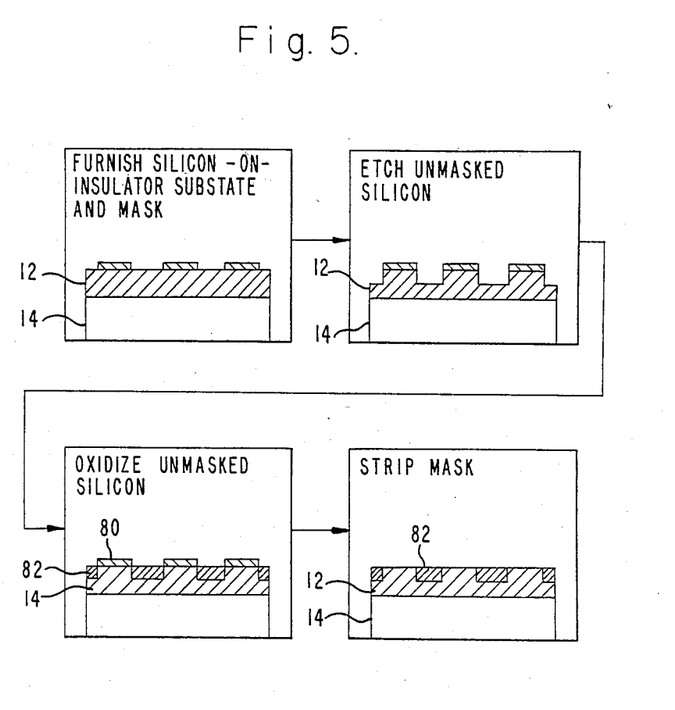
FIG. 5 is a schematic process flow diagram of a process for defining islands in the silicon layer of a silicon-on-insulator wafer base.

FIG. 5 illustrates another preferred technique for defining regions. A silicon layer 12, typically about 0.5 micrometers thick, is first deposited on the insulator substrate 14 as previously described. A mask 80 is then applied to regions of the silicon layer 12 which are subsequently to form the islands 34. The mask 80 is preferably $Si_3N_4$ applied to areas defined by lithography. The masked wafer base 10 is then etched to remove silicon intermediate the masked regions, to a depth of about half the initial thickness of the silicon layer, or about 0.25 micrometers. The wafer base 10 is then oxidized in oxygen at about 910° C. for about 30 minutes, with the mask 80 in place, to oxidize exposed (unmasked) intermediate areas to form intermediate silicon dioxide regions 82, which separate and insulate the islands 34 from each other. The mask 80 is removed. This procedure results in a planar upper surface on the laterally insulated islands 34, with good yields.

In accordance with an aspect of the invention, various regions of the wafer base 10 are selectively optimized by deep-amorphizing and recrystallization treatments. The regions or islands 34 which are not to be implanted in a particular step are masked by conventional techniques to prevent implantation. The present process is applicable to fabricating a wide variety of structures by this selective area technique, but the preferred embodiment illustrated in FIG. 1 relates to the preparation of P-channel FETs and N-channel FETs on a silicon-on-insulator wafer base 10.

Figure 1:
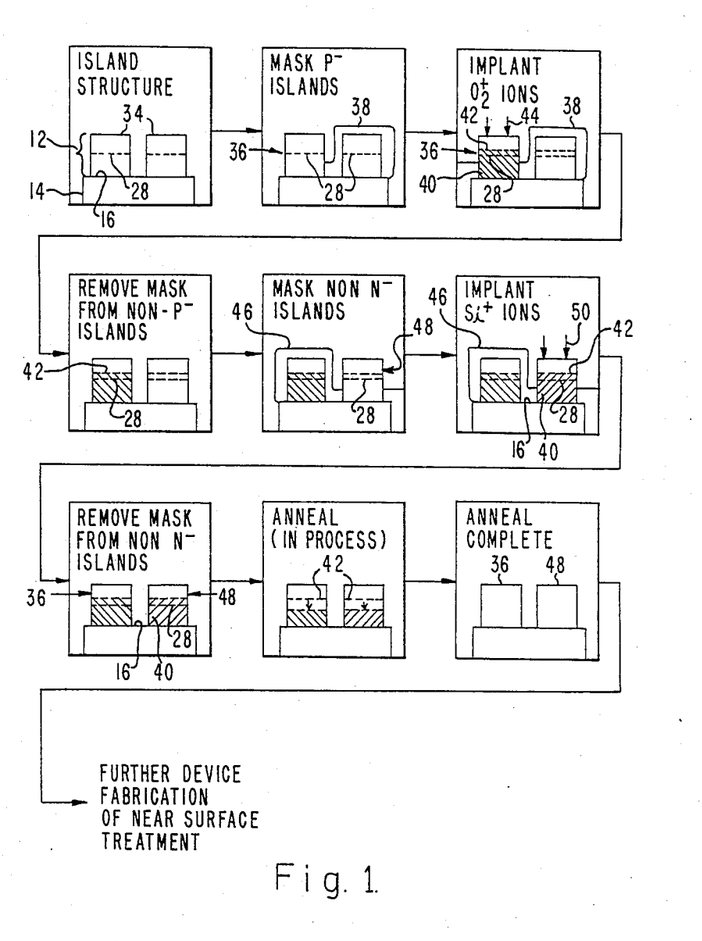
FIG. 1 is a schematic process flow diagram of a selective area process for performing solid phase epitaxy and regrowth of a silicon near-interface layer of a silicon-on-insulator wafer base.

All areas except those which will subsequently become P-channel FETs 36 are first masked and defined by application of a photo-resist layer 38 through which ions cannot be implanted under the implantation conditions next specified. After all areas except the P-channel FET regions 36 are masked, oxygen ions 44 ($O_2^+$) are implanted into a near-interface layer 40, which lies between an upward amorphizing limit 42 and the interface 16. (The upward amorphizing limit 42 may coincide with the lower amorphizing limit 28 to be described subsequently, but in general the two limits need not be the same.) If not, it is preferable that the lower amorphizing limit 28 lie at a slightly greater depth than the upper amorphizing limit 42, so that there is no gap between the near-surface layer 22 and the near-interface layer 40.

The oxygen ions 44 are implanted at a sufficiently high energy and dose to completely amorphize the near-interface layer 40 of the P-channel FET regions 36. However, the implantation conditions should not be such that the underlying portion of the insulator substrate 14 lying below the interface 16 is substantially damaged or amorphized. If damage above a critical threshold to the underlying portion of the insulator substrate 14 were to occur, species might be released from the insulator substrate 14 into the silicon layer 12 lying within the P-channel FET region 36, and the presence of the insulator species could hinder operation of the completed device. More specifically, in the most preferred embodiment wherein the insulator is sapphire, ion implantation damage to the sapphire can release aluminum-containing ions into the silicon layer 12, causing an incursion of the aluminum-containing species by diffusional activation. The use of oxygen implantation mimimizes the electrical effect of mobile aluminum-containing species by creating aluminum-oxygen complexes, thereby electrically inactivating the aluminum ions.

To achieve implantation of the near-interface layer 40, the oxygen ions 44 are preferably implanted at a dose of about $3 \times 10^{15}$ ions per square centimeter and a dose current of less than about 2 microamps per square centimeter to prevent heating of the wafer base 10 during implantation. The implantation energy varies, depending upon the total thickness of the silicon layer 12. Successful implantations have been accomplished for a silicon layer 12 having a thickness of about 0.3 micrometers utilizing an energy of about 190 KeV. Successful implantation for a silicon layer 12 having a thickness of about 0.5 micrometers has been accomplished utilizing an implantation energy of about 280 KeV. The implantation energies for other thicknesses of the silicon layer 12 may be determined by interpolation or extrapolation of a curve through these points. Additionally, if yet another layer were to lie on top of the P-channel FET region 36, such as a silicon dioxide layer (not shown), then the thickness of this added layer would require that the implantation energy be upwardly adjusted to allow implantation through the layer.

As a further means of preventing the incursion of insulator species into the silicon layer 12, the wafer base 10 is cooled during the ion implantation step. In one approach, implantation can be accomplished at liquid nitrogen temperatures, so that the insulator species is essentially immobile. Alternatively, the back side of the insulator substrate 14 may be utilized as a heat sink to remove any induced heat energ rapidly during the ion implantation treatment. Such heat sinking of the wafer base 10 may be accomplished by applying a thick silicon deposit on the back of the insulator substrate 14. Alternatively, a thermally conducting paste may be applied to the back of the insulator substrate 14. In either of these techniques, room temperature implantation may be accomplished. The dose rate or ion current employed during the implantation should be kept to low levels, typically less than about 0.1 microamps per square centimeter, to prevent beam heating. This low dose provides good thermal stability to the amorphorus layer and also prevents incursion of substrate components into the silicon layer 12.

Upon completion of the implantation of the oxygen ions 44, the P-channel FET regions 36 comprise a substantially defect-free layer of silicon lying above the upper amorphizing limit 42, and a substantially fully amorphous near-interface layer 40 lying between the upper amorphizing limit 42 and the interface 16. The amorphizing treatment may induce some minor degree of damage into the layer of silicon lying above the upper amorphizing limit 42, but the subsequent annealing treatment removes the crystalline defect structure. Implantation of oxygen ions into the P-channel FET regions 36, in conjunction with the subsequent annealing treatment to be described, has two important benefits. First, under the subsequent downward recrystallization treatment, the near-interface layer 40 is restored to a substantially defect-free crystalline structure epitaxially related to the underlying insulator substrate 14. Secondly, doping with the N-type oxygen ions electrically compensates for the aluminum-containing species present in the silicon layer 12 adjacent the interface 16, which are present both as a result of the heat treatment procedures and as a result of possible damage due to stray high energy ions during the implantation procedures.

After implantation of the oxygen ions, the P-channel FET regions 36 may be further doped, if desired. For example, normal N-type phosphorus atoms may be implanted using well-established procedures.

With implantation into the P-channel FET regions 36 complete, the photo-resist layer 38 is removed, and a new photo-resist layer 46 is applied to all portions of the upper side of the wafer base 10 except those regions which will subsequently become N-channel FET regions 48. Silicon ions 50 are implanted under conditions to amorphize the near-interface layer 40 of the N-channel FET region 48. As before, the near-interface 40 lies below the upper amorphizing limit 42 and above the interface 16. As illustrated in FIG. 1, the upper amorphizing limit 42 for the P-channel FET regions 36 and the N-channel FET regions 48 may be at the same depth below the surface 26. However, in the broadest form of the invention, the upper amorphizing limit for the regions 36 and 48 need not be at the same depth but instead may be tailored by varying ion implantation energies.

The silicon ions 50 are implanted in an energy and dosage condition sufficient to amorphize the near-interface 40 of the N-channel FET region 48, and in addition to cause damage to the underlying portion of the insulator substrate 14. This damage causes release of the insulator species from the insulator substrate 14 into the silicon layer 12. The ion implantation, in conjunction with the annealing treatment to be described subsequently, thus has two primary effects. First, the near-interface layer 40 is fully amorphized. Second, the near-interface layer 40 is doped $P^{\pm}$, thereby electrically compensating the positive charge otherwise found in the silicon layer 12 adjacent the sapphire interface 16. The electrical compensation is beneficial for the N-channel leakage of the device completed on the N-channel FET region 48.

The preferred dose of silicon ions into the N-channel FET region 48 is about $4.5 \times 10^{15}$ ions per square centimeter, at a dose current less than about 2 microamps per square centimeter, to prevent substrate heating. Substrate heating is undesirable, as it could cause premature and continuous annealing of the amorphized near-interface layer 40. The implantation energy of the silicon ions 50 is dependent upon the thickness of the silicon layer 12. An implantation energy of 190 KeV has been found satisfactory for amorphizing the near-interface layer of a 0.3 micrometer thick silicon layer 12. An implantation energy of about 265 KeV has been found satisfactory for use with a silicon layer 12 having a thickness of about 0.5 micrometers. Energy values for other thicknesses of films can be obtained by interpolating or extrapolating the curve between these two values.

Upon completion of the implantation of silicon ions 50, the N-channel FET regions 48 comprise a crystalline near-surface layer 22 overlying the amorphous near-interface layer 40. The near-interface layer 40 is back-doped with P± aluminum ions generated at the sapphire/silicon interface 16 by the implantation procedure, thereby optimizing structure of the N-channel FET region 48 for subsequent device fabrication. The mask 46 is removed by conventional procedures preparatory to annealing.

At this point of the processing, the near-interface layers 40 of the regions 36 and 48 are amorphous with a high defect density, and would therefore not be operable with a device requiring a low resistivity. The crystallinity and low resistivities of the nearinterface layers 40 are restored by downward epitaxial recrystallization of the near-interface layers 40. Recrystallization begins at the upper amorphizing limit 42 and progresses downwardly toward the interface 16, converting the near-interface layer 40 to a crystalline silicon form having the same crystallographic orientation as the silicon layer lying above the upper amorphizing limit 42. Thus, in effect, the upper amorphizing limit 42 disappears and becomes unrecognizable in the silicon layer 12. Because the portion of silicon crystal above the upper amorphizing limit 42 had been previously recrystallized to have a substantially defect-free (100) crystallographic orientation suitable for an epitaxial relationship to the insulator substrate 14, the near-interface 40 adopts this same epitaxial relationship during the downward recrystallization from the upper amorphizing limit 42. Upon completion of the recrystallization of the near-interface layer 40, the wafer base 10 comprises an insulator substrate 14 having regions 36 and 48 thereon, these regions being substantially defect free silicon single crystals epitaxially related to the underlying insulator substrate 14. In addition, the regions 36 and 48 are doped in the manner previously described.

The preferred annealing treatment includes two substeps, a first substep having a relatively low annealing temperature with a long annealing time, and a second substep having a relatively high annealing temperature for a short annealing time. The first annealing substep should be at a sufficiently high temperature to accomplish the downward recrystallization of the near-interface layers 40. However, the annealing temperature of the first substep should not be so high as to cause aluminum incursion from the insulator substrate 14 into the near-interface layer 40 of the P-channel FET region 36. The preferred conditions of the first substep include a temperature of from about 550° C. to about 650° C., preferably about 600° C. for about 2 hours. The annealing conditions of the second substep include a relatively high temperature for a very short time, to anneal crystal defects in the silicon layer 12, but again to minimize incursion of the substrate species from the insulator substrate 14. The second annealing conditions preferably include a temperature of from about 1000° C. to 1150° C., most preferably 1100° C. for about 2 seconds. FIG. 3 schematically illustrates a temperature-time profile for the preferred annealing treatment. As illustrated, the two steps may be conducted in a continuous fashion, or they may be separated by intermediate cooling of the wafer base 10. However, the continuous approach is preferred, inasmuch as intermediate cooling can induce crystal defects and thermal strains in the wafer base 10.

Figure 4:
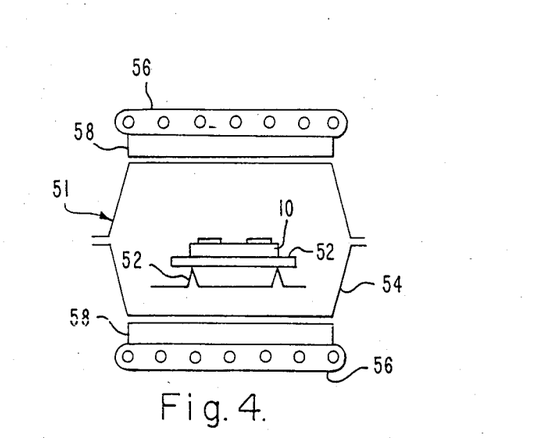
FIG. 4 is a schematic side sectional view of an annealing furnace for accomplishing the annealing process of FIG. 3.

Each of the annealing treatments described previously, to achieve upward recrystallization and downward recrystallization, preferably include very short, high temperature annealing steps. It is preferred that such annealing steps be performed in a transient annealing system 51, wherein the material being annealed is heated by optical radiation provided by banks of high powered lights. FIG. 4 illustrates such a transient annealing system, wherein the wafer base 10 is supported on support means 52 within a container 54. The container 54 is transparent to radiation in the appropriate wavelengths, and provides a gas tight envelope through which annealing atmospheres such as nitrogen or argon gases may be circulated to protect the wafer base 10 during the annealing process. The wafer base 10 is heated by banks of high intensity lamps 56, which are preferably tungsten or halogen arc lamps having a power level of about 1 kilowattt each. The light emitted from the lamps first passes through a quartz diffuser 58 to make the light intensity more uniform, through the sidewalls of the container 54, and to the wafer base 10.

The transient anneal system 51 may be utilized to provide only the very high temperature pulse, such as the two second pulse to 1100° C. illustrated in FIG. 3. Preferably, the entire annealing seqence is conducted within the transient anneal system 51, with the lamps 56 adjusted to a first power level to achieve the lower temperature annealing substep, and then adjusted to a higher power level to achieve the heat pulse required for the second substep. Other techniques capable of providing the high temperature, short duration heating pulse are also acceptable, such as electron beam heating. However, any such technique must be selected with care so that the heating energy will not alter the defect structure, density, or distribution in the completed wafer base 10. The illustrated transient anneal system 51 has been found to meet this requirement, and is therefore strongly preferred in this application.

In accordance with another aspect of the process for optimizing a near-surface layer 22 of the silicon layer 12, and as illustrated in FIG. 2, silicon ions 24 (Si+) are implanted into the near-surface layer 22 of the regions 36 and 48 at an energy and dosage level sufficient to amorphize the near-surface layer 22. That is, the silicon ions 24 are implanted to amorphize the near-surface layer 22, which extends from a surface 26 of the wafer base 10 downwardly to a lower amorphizing limit 28 some distance into the silicon layer 12. Typically, the lower amorphizing limit 28 is about 0.2 to about 0.3 micrometers in depth below the surface 26. At depths greater than the lower amorphizing limit 28, there may be some minor production of crystalline defects in the silicon layer 12 as a result of the implantation procedures, but the implantation voltage and dose levels are selected so that amorphization cannot occur at greater depths. Preferred implantation conditions utilize silicon ions at an energy of 100 KeV and a dose of $2 \times 10^{15}$ ions per square centimeter. Implantation under these conditions results in an amorphous silicon near-surface layer 22 on an underlying doped silicon crystalline layer 30, which is in turn epitaxially related to the insulator substrate 14.

The near-surface layer 22 is then recrystallized by upward epitaxial growth on the underlying silicon crystalline layer 30. To accomplish this upward epitaxial recrystallization, the semiconductor wafer base 10 is annealed at a temperature sufficiently high to induce the epitaxial recrystallization, but not so high as to cause extensive diffusional migration of insulator species from the substrate 14 into the silicon layer 12. Preferably, the annealing treatment is conducted in two substeps, a relatively low temperature, long time first substep, and a relatively high temperature, short time second substep. The first substep includes annealing at a temperature of from about 550° to 650° C. for a time sufficient to cause the upward epitaxial regrowth, and most preferably about 600° C. for a time of about 2 hours. The second substep is accomplished at a higher temperature sufficient to anneal further defects in the silicon layer 12, and is preferably conducted at a temperature of from about 950° to 1100° C., most preferably about 1000° C. for a time of about 5 seconds. Both annealing substeps are preferably conducted in an inert atmosphere such as nitrogen gas, in the rapid transit annealing system utilizing optical radiation.

In the annealing treatment, recrystallization begins at the lower amorphizing limit 28, and proceeds with upward movement of an upward moving recrystallization front 32. The front 32 moves upward to the surface 26, and the annealing treatment is completed. Upon completion of the annealing treatment, each island 34 includes a doped near-interface layer 40 and the near-surface layer 22. The near-surface layer 22 of each island 34 is recrystallized and in a substantially defect-free condition above the lower amorphizing limit 28. The near-interface layer 40 is doped and recrystallized as previously described. The near-surface layer 22 resides in an epitaxial relationship on the underlying doped near-interface layer 40. The near-interface layer 40 in turn resides epitaxially on the insulator substrate 14. This structure may be useful in itself for certain device fabrication operations, but in this preferred embodiment, further processing steps are undertaken to selectively optimize particular regions of the wafer base 10.

Upon completion of either of the annealing steps, the wafer base 10 is cooled at a rate of about 10° C. per minute in the transient anneal system 51 to a temperature of about 500° C. The wafer base 10 is then removed from the transient anneal system 51 and placed on a thermally conducting surface to cool the wafer base 10 to ambient temperature. Care is taken so that the wafer base 10 is not quenched or cooled at a significantly higher rate, as high cooling rates cause production of crystal defects and thermal strains within the wafer base 10, which in turn can interfere with the proper operation of the completed integrated circuit device.

Figure 6:
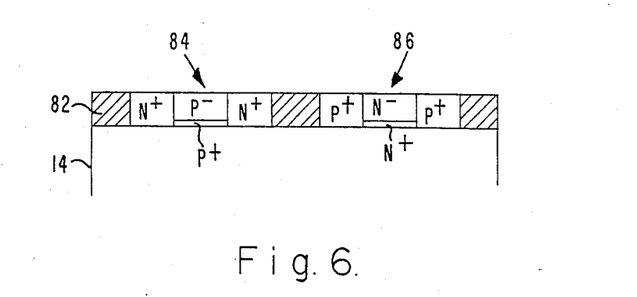
FIG. 6 is a side sectional view of a completed device structure, where the islands have been defined by the process illustrated in FIG. 5.

After completion of the annealing treatment to achieve downward recrystallization, the wafer base 10 processed in accordance with the present invention may be further processed to prepare active devices thereon. The process of the present invention may be utilized at the beginning of the fabrication of the integrated circuit device, or as an intermediate step in a complex sequence of fabrication operations. In either case, the process is fully compatable with other fabrication techniques known in the art. For example, MOSFETs may be fabricated on the regions 36 and 48 by adding a gate structure, source contacts, and drain contacts (not shown). The completed MOSFETs have significant advantages over those previously known in the art, since the effect of the back doping of insulator substrate species on the P-channel MOSFETs is compensated by the implantation and annealing procedures described herein. On the other hand, the beneficial back plane doping of the substrate species is enhanced for N-channel MOSFETs. FIG. 6 illustrates an N-MOSFET 84 and a P-MOSFET 86 fabricated by conventional procedures on the wafer base 10 whose islands were defined by the process illustrated in FIG. 5.

The process of the present invention, and wafer bases fabricated thereby, provide important advantages not previously available in the art. Devices fabricated on the silicon layer of the silicon-on-insulator wafer base are fabricated in substantially defect-free silicon which has been fully recrystallized after deposition by epitaxial recrystallization. The near-surface layer and the near-interface layer of silicon are separately recrystallized in distinct upward and downward recrystallization steps, but after completion of these steps, the entire silicon layer is recrystallized. Recrystallization of the near-interface layer is promoted by a custom tailored ion implantation which achieves a near-interface back plane doping distribution and back plane defect structure appropriate to the specific device to be fabricated thereon. Back plane diffusional doping by the insulator species may be compensated, as by an implantation of oxygen ions into the P-channel FET regions, and enhanced where appropriate, as in the case of silicon implantation to further damage the sapphire layer under an N-channel FET region. Other custom tailoring approaches may also be utilized as appropriate to achieve other desired silicon layer defect concentrations and distributions, and doping concentrations and distributions. The devices made on a wafer base produced by the present approach have reduced sidewall leakage. They also have improved tolerance of external radiation, and thus improved radiation hardness. The process of the present invention is fully compatable with existing semiconductor integrated circuit fabrication technologies.

Although a particular embodiment of the invention has been described for purposes of illustration, various modifications may be made without departing from the spirit and scope of the invention. Accordingly, the invention is not to be limited except as by the appended claims.

What is claimed is:

1. A process for fabricating a semiconductor device, comprising the steps of:

furnishing a sapphire substrate with a monocrystalline silicon layer thereon;

forming at least two islands in said silicon layer such that each of said islands and said substrate defines an interface therebetween;

implanting oxygen ions into a first one of said islands under implantation conditions sufficient to amorphize and N+ dope a thin layer in said first island adjacent its interface with said substrate ano so that said substrate is not amorphized;

implanting silicon ions into a second one of said islands and an underlying portion of said sapphire substrate under implant conditions sufficient to amorphize and P+ dope a thin layer in said second island adjacent its interface with said substrate; and annealing said first and second silicon islands to achieve downward epitaxial recrystallization of the amorphized layers of said first and second islands from the respective crystalline portions of the silicon remote from the respective interfaces with said substrate.

2. A process according to claim 1 wherein the implatation conditions for the silicon ions are sufficient to cause damage to said underlying portion of said sapphire substrate such that aluminum atoms are released from said substrate into said thin layer of said second silicon island and thereby P+ dope said thin layer.

3. A process according to claim 1 wherein the implantation conditions for the step of implanting silicon ions into said second island include an implantation dose of about $2.5 \times 10^{15}$ ions per square centimeter.

4. A process according to claim 1 wherein the implantation conditions for the step of implanting oxygen ions into said first island include an implantation dose of about $3 \times 10^{15}$ ions per square centimeter and a dose current of less than about 2 microamps per square centimeter.

5. A process according to claim 1 further comprising the step of:
  surface amorphizing the top surface layer of said first and second silicon islands, leaving an underlying silicon crystalline layer; and
  annealing said first and second silicon islands to achieve upward epitaxial recrystallization of the amorphized surface layer from the crystalline portion of the silicon remote from the top surface.

6. A process according to claim 1 wherein the step of implanting oxygen ions into said first silicon island is conducted at liquid nitrogen temperatures.

7. A process according to claim 1 wherein the step of forming said islands is by mesa etching.

8. A process according to claim 1 wherein the step of implanting oxygen ions into said first island includes the substeps of:
  masking all areas except those into which oxygen ions are to be implanted;
  implanting the oxygen ions; and removing the mask from the masked areas.

9. A process according to claim 1 wherein the step of implanting silicon ions into said second island includes the substeps of:
  masking all areas except those into which silicon ions are to be implanted;
  implanting the silicon ions; and
  removing the mask from the masked areas.

10. A process according to claim 3 wherein the implantation conditions for the step of implanting silicon ions into said second silicon island further include an implantation energy of about 100 KeV.

11. A process for fabricating a semiconductor device comprising the steps of:
  furnishing a substrate of insulating material with a single crystal semiconductor layer thereon;
  forming at least two islands in said semiconductor layer such that each of said islands and said substrate defines an interface therebetween;
  implanting a first ion species into a first one of said islands under implant energy and dosage sufficient to amorphize and dope to a first conductivity type a thin layer in said first silicon island adjacent its interface with said substrate;
  implanting a second ion species into a second one of said islands under implant energy and dosage sufficient to amorphize and dope to a second conductivity type a thin layer in said second silicon island adjacent its interface with said substrate; and
  annealing said first and second silicon islands to achieve downward epitaxial recrystallization of the amorphized layers of said first and second islands from the respective crystalline portions of the silicon remote from the respective interfaces with said substrate.

* * * * *